United States Patent [19]
Olsen

[11] Patent Number: 5,581,204
[45] Date of Patent: Dec. 3, 1996

[54] PULSE WIDTH MEASUREMENT CIRCUIT

[75] Inventor: Floyd W. Olsen, St. Athens, Pa.

[73] Assignee: International Business Machines Corporation, Armonk, N.Y.

[21] Appl. No.: 458,360

[22] Filed: Jun. 2, 1995

[51] Int. Cl.$^6$ ............................................. H03K 9/08
[52] U.S. Cl. ................................................... 327/31
[58] Field of Search ............................... 327/31; 377/19

[56] References Cited

U.S. PATENT DOCUMENTS

| | | | |
|---|---|---|---|
| 3,708,750 | 1/1973 | Bucks et al. | 324/178 |
| 4,128,892 | 12/1978 | Vasa | 364/900 |
| 4,223,270 | 9/1980 | Schmid et al. | 328/112 |
| 4,562,549 | 12/1985 | Tanaka et al. | 327/31 |
| 4,675,597 | 6/1987 | Hernandez | 324/73 R |
| 4,710,721 | 12/1987 | Camus | 327/31 |
| 5,223,742 | 6/1993 | Schumacher | 307/234 |
| 5,229,894 | 7/1993 | Collins et al. | 360/43 |
| 5,363,406 | 11/1994 | Han | 327/31 |

*Primary Examiner*—Margaret Rose Wambach
*Attorney, Agent, or Firm*—Calfee Halter & Griswold

[57] ABSTRACT

A pulse width measurement circuit is provided, comprising (i) a comparator circuit for receiving a pulse, the time duration of which is to be measured, and for activating a pulse present signal in response to the received pulse; (ii) a counter for counting in response to the pulse present signal and for outputting a pulse count representing the duration of the received pulse; and (iii) a reset circuit for issuing a reset signal in response to a leading edge of the pulse present signal and for automatically resetting the counter to a base count in response to the leading edge of the pulse present signal. The comparator circuit is implemented in ECL circuitry and the counter is implemented in TTL circuitry. An ECL-to-TTL conversion circuit is disposed between the comparator circuit and the counter. The reset circuit includes a counter delay circuit for delaying the resetting of the counter for a predetermined time in response to the leading edge of the pulse present signal. A latch is clocked to store the contents of the counter in response to the trailing edge of the pulse present signal.

19 Claims, 3 Drawing Sheets

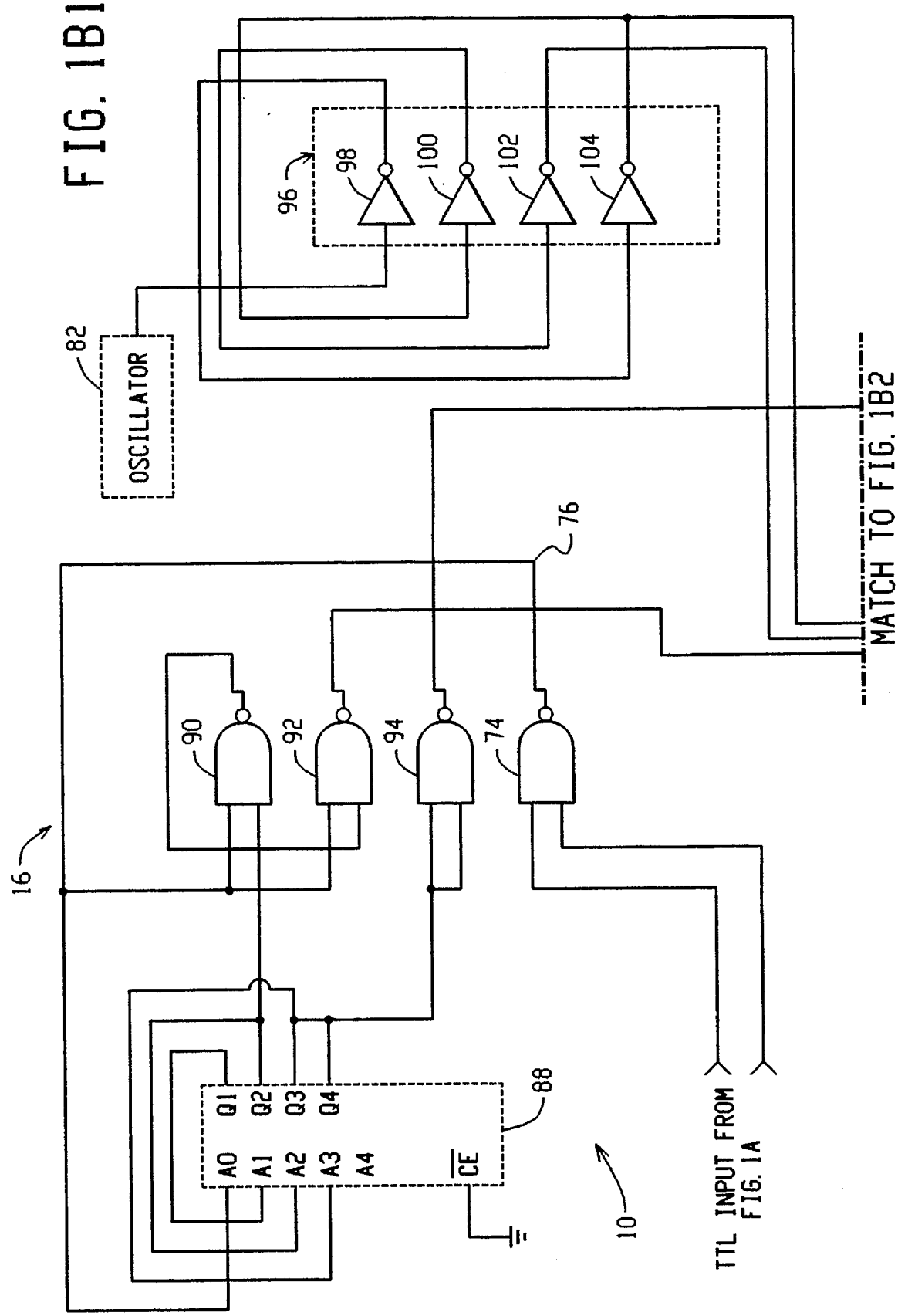

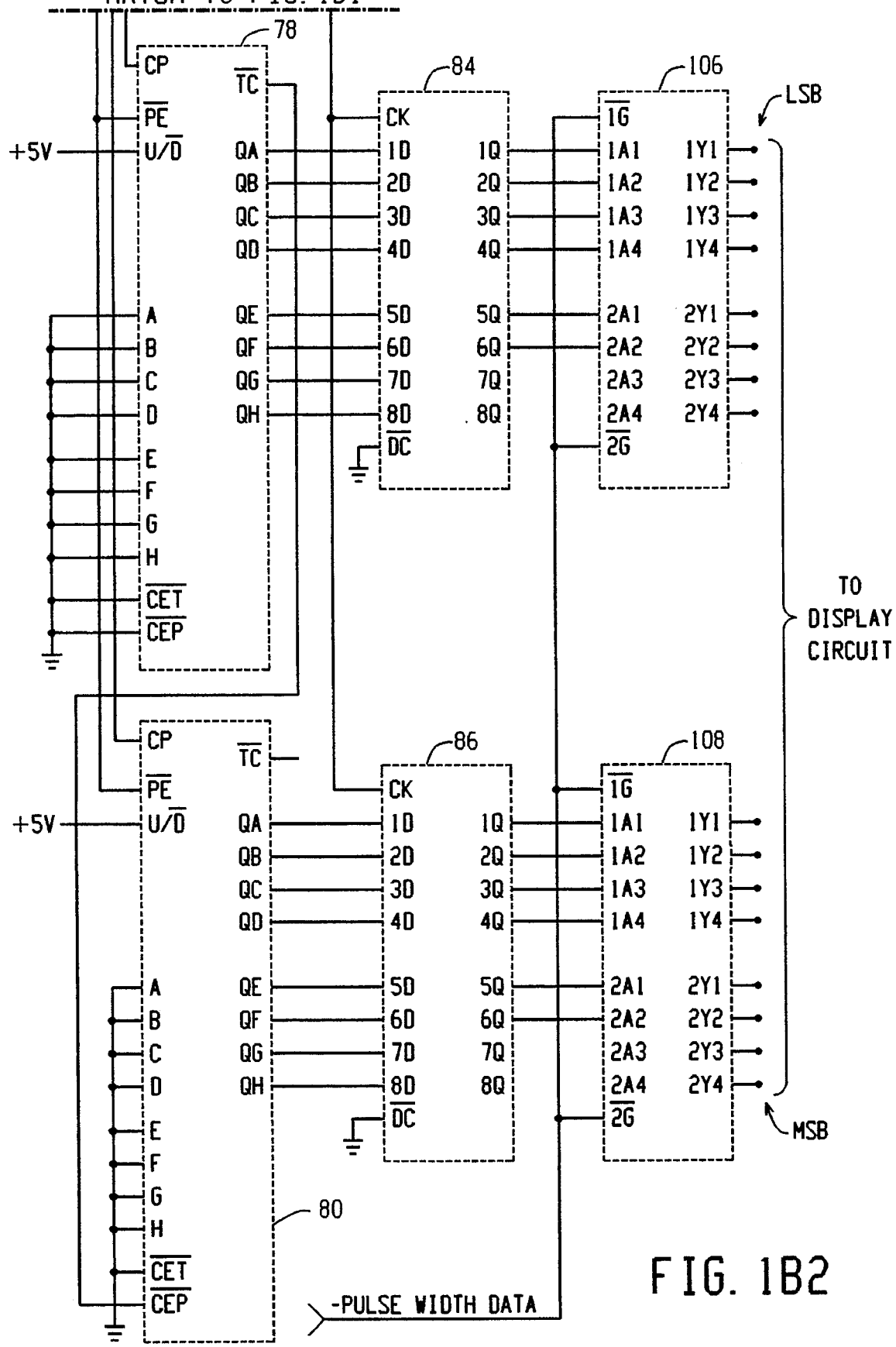
FIG. 1B2

PULSE WIDTH MEASUREMENT CIRCUIT

FIELD OF THE INVENTION

The present invention relates generally to circuitry for measuring the width of an electrical pulse and more particularly to an automatic high speed pulse width measurement circuit.

BACKGROUND OF THE INVENTION

Circuits for measuring the width (time duration) of electrical pulses are known. The pulses are typically in the form of a current or voltage waveform. The measurement circuit receives the waveform and provides a visual display of the width of the received pulse.

Known pulse width measurement circuits, however, suffer from operational drawbacks. First, known pulse width measurement circuits must be reset in a manner so that an incoming pulse "triggers" the measurement circuitry. For example, an oscilloscope must be initialized prior to measuring pulses of different widths. The time during which the circuit is reset reduces the time available for actual pulse width measuring to occur an thus limits the measurement efficiency of the circuit.

In addition, known pulse width measurement circuits are often implemented in transistor-transistor logic (TTL) circuitry. TTL circuitry suffers from a fundamental limitation on its speed of operation which occurs because transistors in the circuit are driven into saturation, resulting in an increased propagation time. Accordingly, electrical pulses of extremely short duration (100 nanoseconds or less) may not be able to be measured by conventional TTL pulse width measurement circuits.

Accordingly it is an object of the present invention to provide an automatic high-speed pulse width measurement circuit which does not require resetting for pulses of different widths and which may accurately measure the width of a pulse of less than 100 nanoseconds.

SUMMARY OF THE INVENTION

A pulse width measurement circuit is provided, comprising (i) a comparator circuit for receiving a pulse, the time duration of which is to be measured, and for activating a pulse present signal in response to the received pulse; (ii) a counter for counting in response to the pulse present signal and for outputting a pulse count representing the duration of the received pulse; and (iii) a reset circuit for issuing a reset signal in response to a leading edge of the pulse present signal and for automatically resetting the counter to a base count in response to the leading edge of the pulse present signal. The comparator circuit is implemented in ECL circuitry and the counter is implemented in TTL circuitry. An ECL-to-TTL conversion circuit is disposed between the comparator circuit and the counter. The reset circuit includes a counter delay circuit for delaying the resetting of the counter for a predetermined time in response to the leading edge of the pulse present signal. A latch is clocked to store the contents of the counter in response to the trailing edge of the pulse present signal.

BRIEF DESCRIPTION OF THE DRAWING

FIGS. 1A, 1B1, and 1B2 taken together, are a schematic of an electronic circuit embodiment of a pulse width measurement device constructed according to the principles of the present invention.

DETAILED DESCRIPTION OF THE PREFERRED EMBODIMENT

Figure 1A:
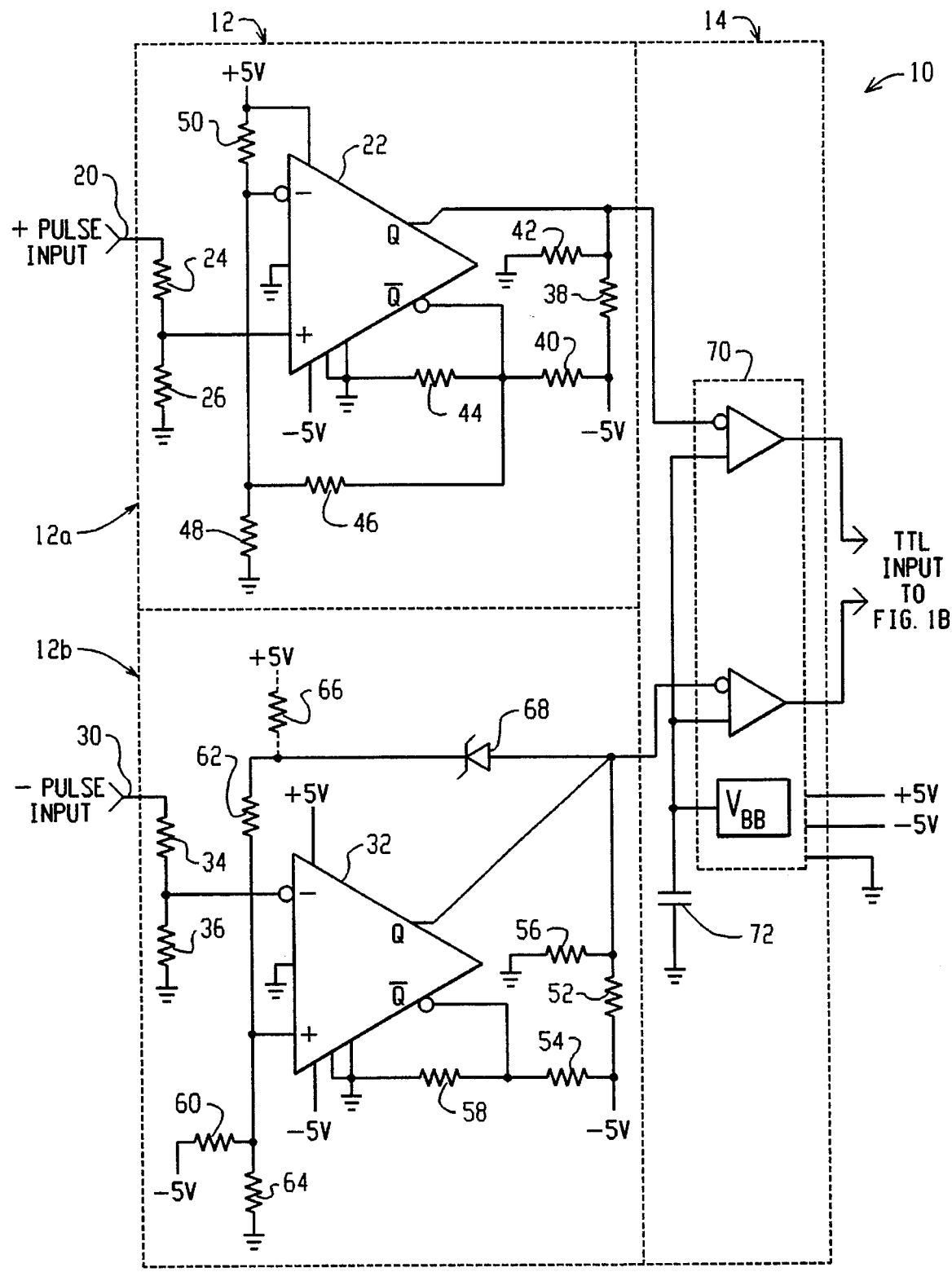

A circuit 10 of a preferred embodiment of the present invention is shown in FIGS. 1A, 1B1, and B2. The circuit 10 shown in these Figures is used to continuously measure the width of each of a stream of pulses in a received current or voltage waveform. The circuit is continuously active in that it need not be reset or triggered upon the detection of each successive pulse.

The received pulses may be either positive or negative, or may be a combination of both positive and negative-going pulses. The circuit 10 shown in FIGS. 1A, 1B1, and 1B2 can handle positive-going pulses from between +5 and +800 volts. Similarly, the circuit 10 can manage negative-going pulses from between −5 and −800 volts.

The circuit 10 comprises a comparator circuit 12 and a conversion circuit 14 (both shown in FIGS. 1A) and a pulse width measurement circuit 16 (shown in FIGS. 1B and 1B2). The comparator circuit 12 includes a positive comparator circuit 12a and a negative comparator circuit 12b. The comparator circuit 12 is implemented in emitter-coupled logic (ECL) circuitry.

The pulse width measurement circuit 16 is implemented in transistor-transistor logic (TTL) circuitry. The ECL comparator circuit 12 is coupled to the TTL measurement circuit 16 by the conversion circuit 14 which converts ECL logic levels present at its input to TTL logic levels at its output.

A positive pulse input is sensed at an input 20 of positive comparator circuit 12a. The positive pulse is applied to the non-inverting input of comparator 22 via a voltage divider network comprising resistors 24 and 26. In the circuit shown, resistor 24 is valued at 32 K $\Omega$ and resistor 26 is valued at 100 $\Omega$. The values of the resistors 24 and 26 are chosen so that the voltage swing at the non-inverting input of comparator 22 is between zero and 2.5 volts full scale for the positive pulse input of between +5 and +800 volts.

A negative pulse input is sensed at an input 30 of negative comparator circuit 12b. The negative pulse is applied to the inverting input of comparator 32 via a voltage divider network comprising resistors 34 and 36. In the circuit shown, resistor 34 is valued at 32 K $\Omega$ and resistor 36 is valued at 100 $\Omega$, so that the voltage swing at the inverting input of comparator 32 is between zero and −2.5 volts full scale for the negative pulse input of between −5 and −800 volts.

The comparators 22 and 32 are in the preferred embodiment type SP9685 comparators (ECL circuitry). Unlike the TTL logic of the pulse width measurement circuit 16, the ECL comparators permit active-region operation of the transistors within the comparators, with stability and switching between this region and cutoff achieved with only a small input-voltage swing. In ECL circuitry, the input voltage does not turn a transistor on and off but will switch a current from one transistor to another. Outputs are taken at the collectors through emitter followers.

The outputs of comparators 22 and 32 swing +/−0.4 volts either side of −1.3 volts. That is, the logical HIGH output of the comparators is −0.9 volts and the logical LOW output of the comparators is −1.3 volts. The non-inverted outputs of each of these comparators is sent directly to the ECL-to-TTL conversion circuit 14 so that the comparator outputs may be converted to TTL logic levels for detection and manipulation by the TTL measurement circuit 16.

Both the inverted and non-inverted outputs of the comparators 22 and 32 are fed back into the inverting and non-inverting inputs of comparators 22 and 23, respectively, via a feedback network. The feedback network for positive comparator circuit 12a comprises resistors 38, 40, 42, 44, 46, 48, and 50. Resistors 38 and 40 are 130 Ω; resistors 42 and 44 are 82 Ω; and resistors 46, 48 and 50 are 56 K Ω, 100 Ω and 33 K Ω, respectively.

The feedback network for negative comparator circuit 12b comprises resistors 52, 54, 56, 58, 60, 62, 64 and 66, and 2.2 volt zener diode 68. Resistors 52 and 54 are 130 Ω; resistors 56 and 58 are 82 Ω; resistors 60 and 62 are 33 K Ω; and resistors 64 and 66 are 100 Ω and 2 K Ω, respectively. Zener diode 68 offsets the output voltage present at the non-inverted input of comparator 32.

The feedback networks for the positive and negative comparator circuits 12a and 12b provide noise reduction for small magnitude input pulses. The feedback networks also serve to feed back an out of phase signal to their respective comparators to exaggerate the differential being measured by the comparator to prevent hysteresis.

Thus, when either a positive or negative pulse is present at the inputs 20 or 30 of comparator circuit 12, the outputs of comparators 22 and 32, respectively, are at an ECL logical high level (−0.9 volts). The ECL to TTL converter circuit 14 includes a converter 70 (type-MC10125L) which converts this ECL logical high level to a TTL logical high level of +5 volts. An internal voltage reference $V_{bb}$ is tied to all of the unused inputs of the converter 70. A capacitor 72 (0.1 microfarad (μ F)) filters this voltage reference.

The TTL outputs of the ECL-to-TTL converter 70 are used as inputs to the TTL measurement circuit 16 (see FIGS. 1B1 and 1B2). Both outputs derived from the positive and negative comparator circuits are combined at NAND gate 74 to provide a pulse present signal 76 to the TTL measurement circuit 16, representing the leading edge of the pulse being measured. The pulse present signal is active (positive) whenever either of the outputs of comparators 22 or 32 is active (−0.9 volts). The leading edge of the pulse present signal 76 is used to reset a pair of counters 78 and 80 which are driven by an oscillator 82 to provide a numerical count representing the width of the pulse detected by the comparator circuit 12. The trailing edge of the pulse present signal is used to reset a pair of latches 84 and 86 which provide a snapshot of the last count indicated by the counters 78 and 80 when the pulse being measured ends.

The manner in which the pulse present signal 76 resets the counters 76 and 78 (type 74F269) to a base (zero) count is as follows. The pulse present signal 76 is sent to the first address line $A_0$ of programmable read only memory (PROM) 88, and to one input of second and third NAND gates 90 and 92. The PROM 88 (type 82S123N) acts as a delay device (without signal degradation) for delaying the resetting of counters 78 and 80 and latches 84 and 86 by feeding the first output line $Q_1$ corresponding to the first address line $A_0$ back into the second address line $A_1$ of PROM 88. The second output line $Q_2$ is sent to the third address line $A_2$ and to the second input of NAND gate 90 (the first input of which having been fed by the pulse present signal 76). The output of NAND gate 90 is sent to the second input of NAND gate 92 (the first input of which also having been fed by the pulse present signal 76). The output of NAND gate 92 resets the counters by activating (driving low) the inverted PE (parallel enable) lines of each of the counters to load all zeros into the counters. Accordingly, the counters 78 and 80 are reset by the pulse present signal 76 after a delay of two PROM memory access times (typically 25–30 nanoseconds each) and the delay provided by NAND gates 90 and 92 (typically 5 nanoseconds each). Thus, the counters 78 and 80 are reset approximately 60–70 nanoseconds after the pulse present signal 76 is activated.

The counters count at the rate provided by the oscillator 82 which is continuously operating. In the preferred embodiment, the oscillator oscillates at 80 megahertz (MHz), although the use of faster or slower clocks is contemplated. However, the counters are incapable of beginning to count immediately after they are reset by the inverted PE line, because they require a recovery time after being reset in which they will not respond to the oscillator. Accordingly, a delay circuit 96 is provided for introducing a delay between the oscillator 82 and the counters 78 and 80. The delay circuit 96 comprises four inverters 98, 100, 102 and 104. Each inverter provides on the order of 2.5 nanoseconds delay.

The delay must be different for each of the counters 78 and 80 because the clock pulse (CP) inputs for these counters cannot be tied together for the cascaded configuration of counters shown. Therefore, the output of the oscillator 82 passes through two inverters (98 and 104) before it is passed on to the CP input of counter 78, while the output of the oscillator 82 passes through all four inverters in the delay circuit 96 before it is passed on to the CP input of counter 80.

Accordingly, after the leading edge of the pulse to be measured activates the pulse present signal 76, the counters begin counting after approximately 65–75 nanoseconds (two PROM memory access times of 25–30 nanoseconds each, plus five nanoseconds for each NAND gate 90 and 92, and five more for the delay circuit inverters 98 and 104). Therefore, when the pulse to be measured ends, a similar trailing edge delay must be introduced by the measurement circuit 16 to compensate for that delay introduced upon detection of the leading edge of the pulse. The trailing edge delay is provided by PROM 88 and NAND gate 94 as follows.

When the pulse (the width of which the measurement circuit 16 is measuring) is complete, the comparator circuit 12 detects a trailing edge of the pulse and deactivates the pulse present signal 76. With the pulse present signal deactivated, output $Q_2$ of the PROM 88 goes negative after two PROM memory access cycles, and is fed into address line $A_2$ of the PROM. Output $Q_3$ of the PROM is fed into both inputs of NAND gate 94. The output of NAND gate 94 is then sent to the clock input of latches 84 and 86 so that the present counts loaded into the counters 78 and 80 are latched into latches 84 and 86, respectively.

Accordingly, the latches 84 and 86 are clocked approximately 80–95 nanoseconds after the trailing edge of the pulse to be measured drives the pulse present signal 76 inactive (three PROM memory access times at 2–30 nanoseconds each plus 5 nanoseconds for the delay provided by NAND gate 94. This trailing edge delay is slightly greater than the leading edge delay (65–75 nanoseconds) introduced by measurement circuit 16 because data at the input of the latches 84 and 86 must be present for several nanoseconds before it can be effectively clocked into the latches.

In this manner, a count which represents the width of each successive pulse detected by the circuit 10 is stored in the latches 84 and 86. This data may be output by the latches to a pair of buffers 106 and 108 (type 74LS244), and output by the buffers to circuitry (not shown) for further processing. For example, the contents of the buffers may be sent to a binary-to-seven segment display circuit so that a numerical representation of the pulse width may be displayed on a display unit.

As shown in FIGS. 1B1 and 1B2, a computer controlled signal -PULSE WIDTH DATA is tied to the inverted 1G and 2G inputs of each of the buffers 106 and 108. This control signal provides the means by which a computer may automatically request the buffer to output its pulse-width data contents. The data present in the buffer is a representation of the width of the most recent pulse detected.

Because in the disclosed circuit an 80 MHz ($8\times10^7$ cycles per second) oscillator is utilized, each count of the counters 78 and 80 represents the inverse of this value or 12.5 nanoseconds. Accordingly, the least significant bit (LSB) contained in buffer 106 represents a pulse width (duration) of 12.5 nanoseconds, while the most significant bit (MSB) in buffer 108 represents a pulse width (duration) of 102.4 microseconds ($\mu$ sec). In this manner, the circuit 10 provides a high degree of accuracy in measuring the width of a detected pulse. In addition, the measurement circuit can run continuously, detecting and measuring the varying width of a pulse every 100 nanoseconds. The circuit need not be reset intermediate successive pulses, nor triggered on each individual pulse. Moreover, the circuit need not be altered to accommodate a wide range of input pulse voltage levels.

Accordingly, the preferred embodiment of a pulse width measurement circuit has been described. With the foregoing description in mind, however, it is understood that this description is made only by way of example, that the invention is not limited to the particular embodiment described herein, and that various rearrangements, modifications, and substitutions may be implemented to the disclosed circuit without departing from the true scope of the invention as defined by the following claims and their equivalents. In particular, although components of the disclosed circuit are described with particularity, it is contemplated that other components which are capable of performing similar functions may be substituted for those components disclosed.

I claim:

1. A pulse width measurement circuit, comprising:
   (i) a comparator circuit for receiving a pulse the time duration of which is to be measured, and for activating a pulse present signal in response to said received pulse;
   (ii) a counter for counting in response to said pulse present signal and for outputting a pulse count representing the duration of said received pulse; and
   (iii) a reset circuit for issuing a reset signal in response to a leading edge of said pulse present signal and for automatically resetting said counter to a base count in response to said leading edge of said pulse present signal.

2. The measurement circuit of claim 1, wherein said comparator circuit is implemented in ECL circuitry and said counter is implemented in TTL circuitry, said measurement circuit further comprising an ECL-to-TTL conversion circuit disposed between said comparator circuit and said counter.

3. The measurement circuit of claim 2, wherein said comparator circuit comprises a positive comparator circuit and a negative comparator circuit for receiving, respectively, positive-going and negative-going pulses.

4. The measurement circuit of claim 3, wherein said positive-going and negative-going pulses are between +5 and +800 and −5 and −800 volts, respectively.

5. The measurement circuit of claim 2, wherein said reset circuit includes a counter delay circuit for delaying said resetting of said counter for a predetermined time in response to said leading edge of said pulse present signal.

6. The measurement circuit of claim 5, wherein said counter delay circuit comprises a programmable read only memory (PROM) circuit.

7. The measurement circuit of claim 5, wherein said comparator circuit continuously measures the duration of a series of pulses every approximately 100 nanoseconds.

8. The measurement circuit of claim 5, wherein said counter counts at a rate provided by an oscillator, and said oscillator is provided with an oscillator delay circuit for delaying the response of said counter to said oscillator by a predetermined time period.

9. The measurement circuit of claim 8, wherein said oscillator oscillates at 80 megahertz.

10. The measurement circuit of claim 1, further comprising a latch which is clocked to store the contents of said counter in response to deactivation of said pulse present signal by said comparator circuit.

11. The measurement circuit of claim 10, wherein said comparator circuit comprises a positive comparator circuit and a negative comparator circuit for receiving, respectively, positive-going and negative-going pulses.

12. The measurement circuit of claim 11, wherein said positive-going and negative-going pulses are between +5 and +800 and −5 and −800 volts, respectively.

13. The measurement circuit of claim 10, wherein said reset circuit includes a counter delay circuit for delaying said resetting of said counter for a predetermined time in response to said leading edge of said pulse present signal.

14. The measurement circuit of claim 13, wherein said counter delay circuit comprises a programmable read only memory (PROM) circuit.

15. The measurement circuit of claim 13, wherein said comparator circuit continuously measures the duration of a series of pulses every approximately 100 nanoseconds.

16. The measurement circuit of claim 13, wherein said counter counts at a rate provided by an oscillator, and said oscillator is provided with an oscillator delay circuit for delaying the response of said counter to said oscillator by a predetermined time period.

17. The measurement circuit of claim 16, wherein said oscillator oscillates at 80 megahertz.

18. The measurement circuit of claim 10, further comprising a buffer circuit into which the contents of said latch may be moved in response to a control signal.

19. The measurement circuit of claim 10, further comprising a latch delay circuit for delaying the clocking of said latch for a predetermined time upon deactivation of said pulse present signal by said comparator circuit.

\* \* \* \* \*